United States Patent
Ohno et al.

[11] Patent Number: 5,942,286
[45] Date of Patent: Aug. 24, 1999

[54] METHOD FOR MANUFACTURING ORGANIC MONOMOLECULAR FILM

[75] Inventors: Hirotaka Ohno; Shangjr Gwo; Hiroshi Tokumoto, all of Tsukuba, Japan

[73] Assignees: Agency of Industrial Science and Technology; Angstrom Technology Partnership, both of Tokyo; Sharp Corporation, Osaka, all of Japan

[21] Appl. No.: 08/733,990

[22] Filed: Oct. 18, 1996

[30] Foreign Application Priority Data

Oct. 18, 1995 [JP] Japan ................................ 7-294716

[51] Int. Cl.$^6$ ........................................................ B05D 3/00
[52] U.S. Cl. ...................... 427/352; 427/443.2; 427/435; 427/430.1; 427/444; 355/85; 355/210; 355/211
[58] Field of Search .................................. 427/352, 430.1, 427/435, 443.2, 444; 355/85, 210, 211

[56] References Cited

U.S. PATENT DOCUMENTS

| | | | |
|---|---|---|---|
| 5,209,976 | 5/1993 | Ogawa | 428/391 |
| 5,424,098 | 6/1995 | Nislyama et al. | 427/352 |
| 5,445,886 | 8/1995 | Ogawa | 428/403 |
| 5,519,469 | 5/1996 | Obata | 335/210 |

FOREIGN PATENT DOCUMENTS 6-39275  2/1994  Japan .

*Primary Examiner*—Merrick Dixon
*Attorney, Agent, or Firm*—Oblon, Spivak, McClelland, Maier & Neustadt, P.C.

[57] ABSTRACT

The present invention provides a method for selectively allowing film-forming molecules to be chemically adsorbed onto an Si substrate to produce a good and robust organic monomolecular film, wherein molecules with SH groups are chemically adsorbed onto the Si substrate to form a monomolecular film of the molecules by heating an As molecular beam source 4 to allow a monoatomic layer thickness of arsenic to be adsorbed onto the clean surface of the Si substrate set on a sample stage 3 and then immersing the Si substrate terminated by arsenic in a solution containing molecules with SH groups.

9 Claims, 3 Drawing Sheets

METHOD FOR MANUFACTURING ORGANIC MONOMOLECULAR FILM

BACKGROUND OF THE INVENTION

1. Field of the Invention

The present invention relates to an organic monomolecular thin-film manufacturing method for manufacturing an organic monomolecular film arranged two-dimensionally on an Si substrate.

2. Description of the Prior Art

Conventional organic monomolecular films include Langmuir Blodgett films (hereafter referred to as "LB films") and self-assembled monolayers (Abraham Ulman: An Introduction to Ultrathin Organic Films From Langmuir-Blodgett to Self-Assembly, Academic Press 1991).

An LB film is formed by developing on a water surface, as a monomolecular film, amphipathic molecules including hydrophilic groups and hydrophobic groups (an L film). The film is transferred onto a solid substrate, and several such films are accumulated thereon, according to the process named after Langmuir and Blodgett. A self-assembled monolayer is obtained by allowing the functional groups at the terminals of molecules to be chemically adsorbed by the atoms constituting the substrate. This film is called the "self-assembled monolayer" because, due to the relevant adsorption mechanism, only monomolecular films are self-organized and formed on the substrate.

Films can also be accumulated by selecting the type of the terminal group outside a formed self-assembled monolayer. These monomolecular films form a two-dimensional monomolecular aggregate due to the Van der Waals force of the molecules, and these methods can be used to manufacture a regular arrangement of molecular packings, that is, two-dimensional crystals. This feature can be used to construct electronic and optical devices.

Since an LB film is formed by transferring a film developed on the water surface, onto the substrate, using the difference between the hydrophobic and hydrophilic properties of the film and the substrate, the crystallinity of the film is determined when the film is expanded and compressed. Thus, the crystallinity of the film does not depend on the type of the substrate, and the film can be formed on any substrate. The interaction between the substrate and the monomolecular film, however, is very weak due to the nature of the LB film, and the film lacks the acid- and alkali-resistance and durability required to construct complicated devices.

On the other hand, the self-assembled monolayer does not have the above disadvantages, but due to the use of the chemical adsorption between the functional groups of molecules and the substrate, their range of combinations is limited. Monomolecular films have thus been implemented on substrates of silicon oxide, aluminum oxide, silver oxide, mica, gold, copper, or GaAs. For silicon substrates, only self-assembled monolayers using the covalent bonding between a silicon oxide film and $SiCl_8$ group have been obtained.

Since, however, the self-assembled monolayer uses the chemical reaction between an amorphous oxide film and $SiCl_8$ groups on silicon, the crystallinity of a self-assembled monolayer obtained has been very poor, that is, the quality of this film has been lower than that of the LB film. The film quality directly relates to quantum efficiency that provides a functionality characteristic of that monomolecular film, and thus contributes to producing substantial adverse effects in manufacturing devices.

BRIEF SUMMARY OF THE INVENTION

It is an objective of this invention to provide an organic monomolecular film manufacturing method that can manufacture a good and robust organic monomolecular film by selectively allowing film-forming molecules to be chemically adsorbed onto an Si substrate.

To achieve the above objective, the organic monomolecular film manufacturing method according to this invention is characterized by the following steps: allow a monoatomic layer thickness of arsenic to be chemisorbed onto the clean surface of an Si substrate, then allow molecules with SH groups (thiol groups) to be chemically adsorbed thereon in order to form a monomolecular film of the molecules on the Si substrate.

In allowing molecules with SH groups to be chemically adsorbed to form a monomolecular film, this monomolecular film manufacturing method can use means for immersing the Si substrate terminated by arsenic in a solution containing molecules with SH groups, coating molten molecules with SH groups on the Si substrate terminated by arsenic, or exposing the Si substrate terminated by arsenic to vaporized molecules with SH groups.

The organic monomolecular film manufacturing method method according to this invention allows a monoatomic layer thickness of arsenic to be chemisorbed onto the clean surface of an Si substrate, and then allows molecules with SH groups to be chemically adsorbed thereon in order to form a monomolecular film from the molecules on the arsenic terminated Si substrate, as described above. Surface contaminants must be removed prior to the chemisorption of arsenic. In this case, the sample is generally transferred to any location, and an As molecule deposition source is heated from 250 to 1,000° C. preferably from 300 to 600° C., and more preferably to 350 to 400° C.

When a monomolecular film of molecules with SH groups is formed on a substrate and if the substrate is immersed in a solution of octadecanethiol diluted to 1 mM with, for example, pure ethanol, the immersion time may generally be several tens of minutes to ten days, and is preferably 10 hours to seven days, or more preferably one to three days. If octadecanethiol, which has been molten by heating, is coated on the substrate, then the substrate is preserved for several tens of minutes to one day, and the retention time is preferably two to ten hours, and more preferably about five hours. If the substrate is exposed to vaporized molecules with SH groups, the substrate is exposed for several seconds to several tens of hours, preferably about one minute to one hour, and more preferably about five to ten minutes.

Although this invention has been described in conjunction with the use of octadecanethiol to obtain a monomolecular film, the invention is generally applicable to the formation of films of any molecules containing SH groups.

According to the present method, the surface of the Si substrate is terminated with arsenic atom and the selective chemisorption between the substrate and molecules having SH groups at their end group is used, so a monomolecular film of good quality strongly forms on the substrate. This invention can thus maximize the functionality of the film and manufacture films that have acid and alkali resistance and which are stable and robust.

Furthermore, this invention selectively allows film-forming molecules to be chemically adsorbed onto the Si substrate in order to make a two-dimensional monomolecular thin film that has good crystallinity and that strongly binds to the substrate, thereby improving the efficiency of nonlinear optical characteristics compared with conventional techniques such as LB method and improving the sensitivity of sensors that incorporate these characteristics. Such monomolecular films with good adhesion can be used as resist films for ultrafine processing of highly integrated devices.

DETAILED DESCRIPTION OF THE INVENTION

An embodiment of this invention is shown below.

Embodiment 1

Figure 1:
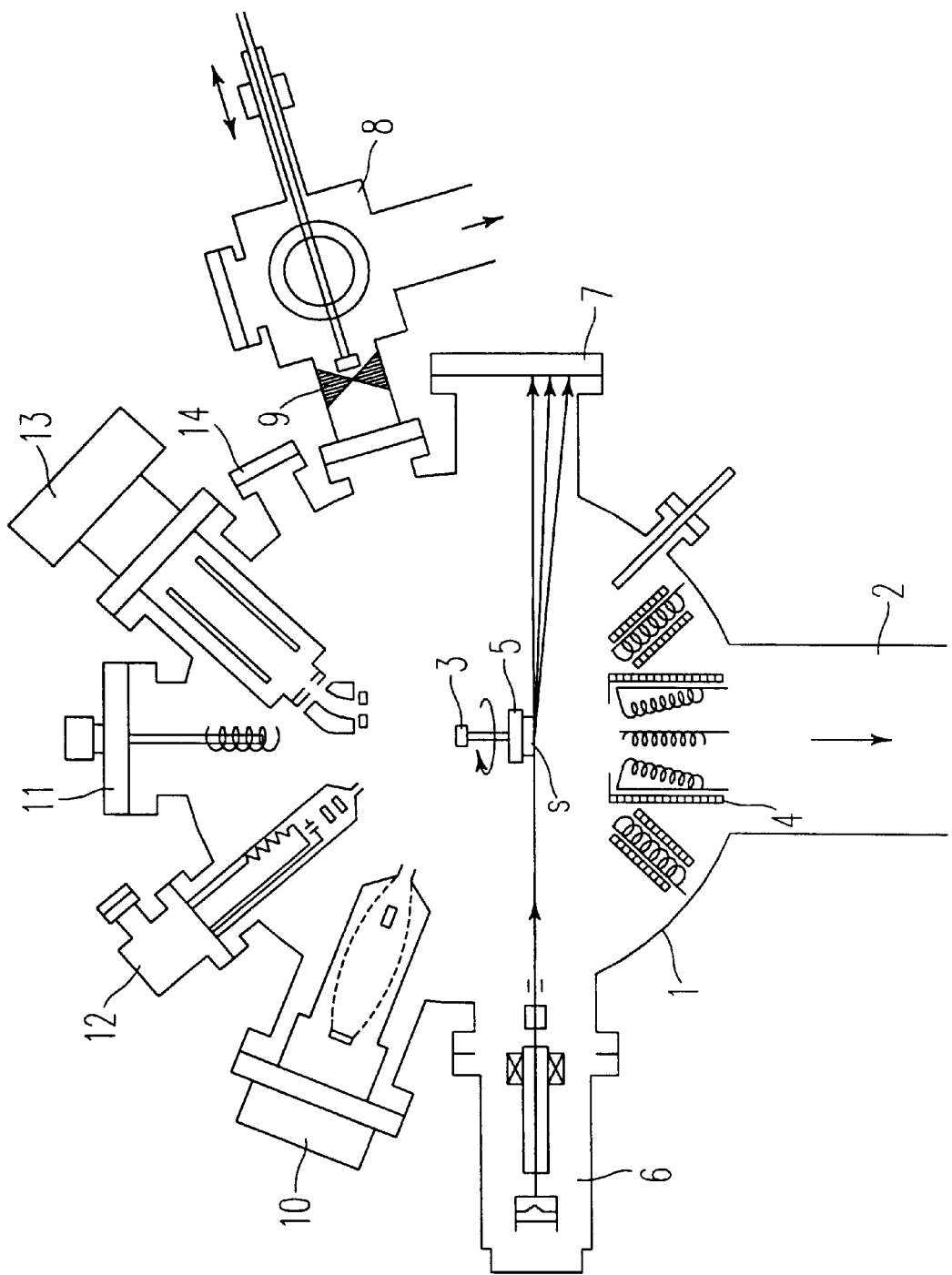
FIG. 1 is a schematic diagram of the configuration of an apparatus used in Embodiments 1 and 2 of this invention.

FIG. 1 schematically shows a monomolecular film manufacturing apparatus that was used to manufacture organic monomolecular films according to this invention.

In this figure, a growth chamber 1 is connected to an evacuation system 2 so as to be evacuated until the pressure reaches $10^{-10}$ Torr. A sample stage 3 in the growth chamber 1 is positioned perpendicularly to a molecular beam source 4 for As, which is a material for monolayer termination and has an intra-surface rotating mechanism for uniformly depositing a film within the surface, and also has a heater 5 for heating a sample S on the stage 3. The AS molecular beam source 4 comprises a Knudsen cell as in conventional techniques, but is preferably a valved cracker cell. The growth chamber 1 includes an electron gun 6 for low-energy electron diffraction used for evaluating the crystallinity of the surface of the sample S and monitoring the deposition speed and a screen 7 for observing the diffraction pattern of electrons reflected by the sample surface.

In the figure, 8 is a loadlock vacuum chamber for sample introduction, 9 is a gate valve, 10 is a cylindrical mirror type energy analyzer for analyzing Auger electron to investigate composition of surfaces, 11 is an ionization vacuum gauge for monitoring the vacuum pressure during the deposition of a film, 12 is an ion gun that uses ion sputtering to clean the surface of the sample, 13 is a quadrupole pole mass spectrometer for analyzing the mass of atoms or molecules emitted from the molecular beam source 4, and 14 is a viewing port.

An example of a monomolecular film manufacturing method using the apparatus described above is described below.

Before performing to form a monomolecular film, the As molecular beam source 4 was preheated to remove surface cotamination on itself. A wet cleaned Si (111) substrate was transferred from the loadlock vacuum chamber 8 for sample introduction to the sample stage 3, heated to about 300° C. by the heater 5, and kept overnight until the vacuum was recovered. The sample was further heated to about 1,250° C. and then cooled down slowly.

As a result, the screen 7 for monitoring the diffraction pattern of electrons reflected by the sample showed a period seven times as large as the normal Si lattice constant and indicated that the surface had a 7×7 surface reconstructed structure. When this periodic structure was not obtained, the surface of the sample was etched using ion beams from the ion gun 12 in order to clean the surface, and the above procedure was repeated to obtain a 7×7 Si surface reconstructed structure.

The sample was then transferred to another place in which it would not be exposed to the molecular beam, and the As molecular beam source 4 was heated to about 350 to 400° C. At this point, As molecules leak from the shutter of the molecular beam source 4, and therefore the vacuum pressure decreased to about $10^{-9}$ to $10^{-8}$ Torr. The shutter was then opened, and the mass spectrometer 13 was used to check whether As molecules had been emitted from the As molecular beam source 4. As a result, a peak of $As_4$ molecule with a mass of 299.4 was observed, indicating that As molecules had been emitted into the vacuum. The shutter of the molecular beam source 4 was again closed, the sample was transferred to a position in which it was faced to molecular beams, and the molecular beam source was heated to 500° C. The shutter was opened, and the diffraction pattern of low-energy electron beams gradually changed to modify the surface to a 1×1 structure.

The shutter of the As molecular beam source 4 was closed after quenching the sample S. The Auger electron spectroscopy was used to investigate the composition of the surface. An AS (1230 eV) peak was observed in addition to an Si (92 eV and 1589 eV) peak, and the peak ratio of the elements was calculated to confirm that a monoatomic layer thickness of As was chemisorbed onto the Si substrate and that the Si surface terminated with As atoms.

Figure 2:
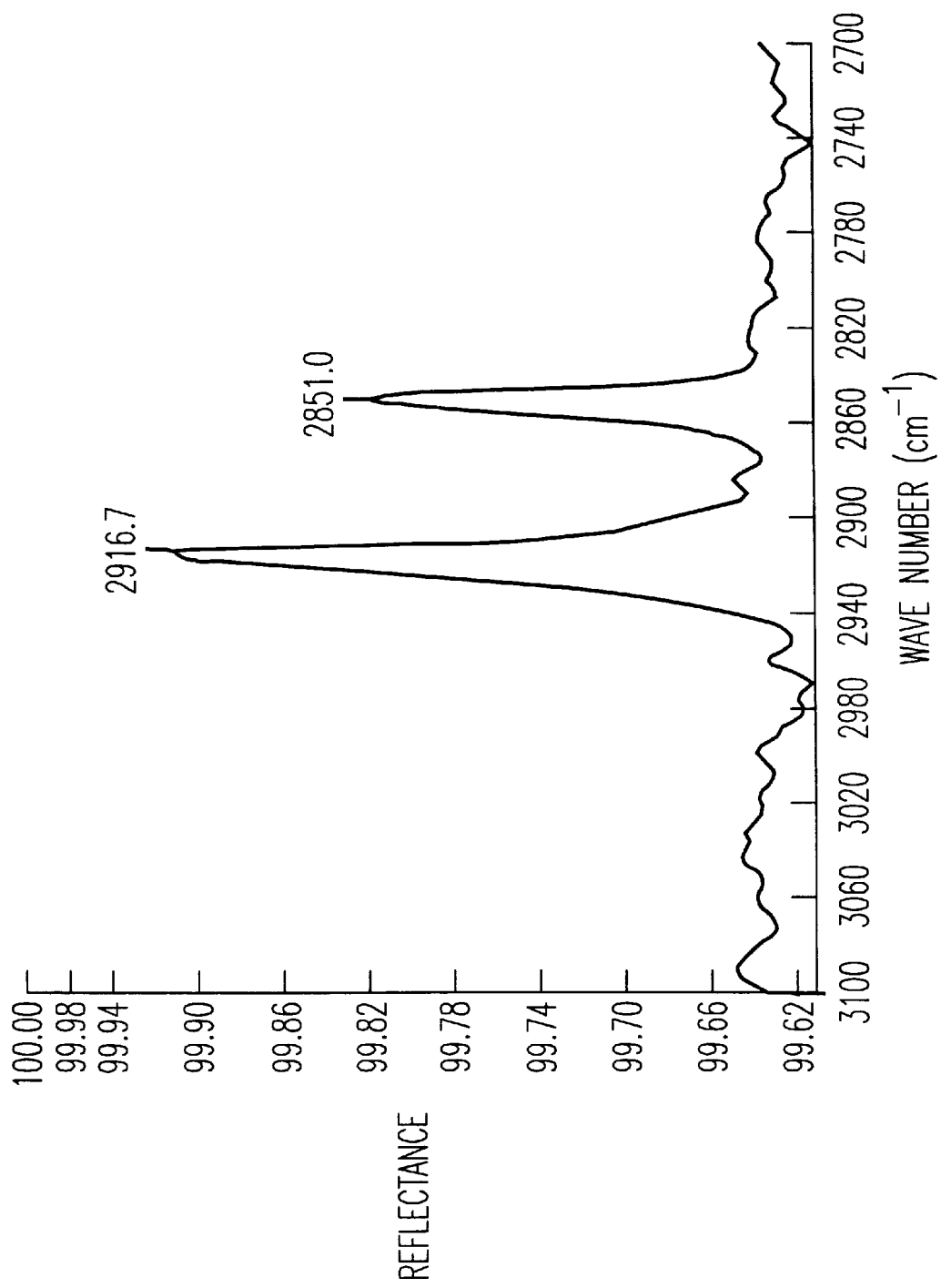
FIG. 2 is a chart showing an infrared adsorption spectrum of a monomolecular film obtained by Embodiment 1 of this invention.

The sample was again transferred to the loadlock vacuum chamber 8 and to the atmosphere then taken out from the chamber. The sample S was immersed and retained in an octadecanethiol solution diluted to 1mM with pure ethanol for about two days. The sample was removed from the solution and rinsed with pure ethanol. Dry nitrogen was then used to remove excesive ethanol from the sample surface. The sample obtained was investigated with reflection absorption infrared spectroscopy, and absorption was observed at 2916.7 $cm^{-1}$ and 2851.0 $cm^{-1}$, as in the infrared absorption spectrum shown in FIG. 2. The surface was also investigated using photoelectron spectroscopy. It was found that the As (1326 eV) and the Si (102 eV) peaks decreased, and a C (287 eV) peak that had not been detected theretofore was observed. This indicated that a monomolecular film of octadecanethiol molecules had been formed on the Si surface terminated by As.

Embodiment 2

An Si (111) sample S terminated by As produced in the same manner as in Embodiment 1 was transferred to the loadlock vacuum chamber 8 for sample introduction and then then taken out from the chamber. Octadecanethiol, which had been prepared and melted with heating, was coated on the surface of the sample S and preserved for about five hours. The sample S was then rinsed with ethanol to remove excessive octadecanethiol and then dried with nitrogen. The sample S obtained was investigated with the reflection absorpition infrared spectroscopy, and absorption was observed at 2916.7 $cm^{-1}$ and 2851.0 $cm^{-1}$ as in FIG. 2. The surface was also investigated using the photoelectron spectroscopy, and it was found that the As (1326 eV) and the Si (102 eV) peaks decreased and a C (287 eV) peak that had not been detected theretofore was observed. This indicated that a monomolecular film of octadecanethiol molecules had been formed on the Si surface terminated by As.

Embodiment 3

Figure 3:
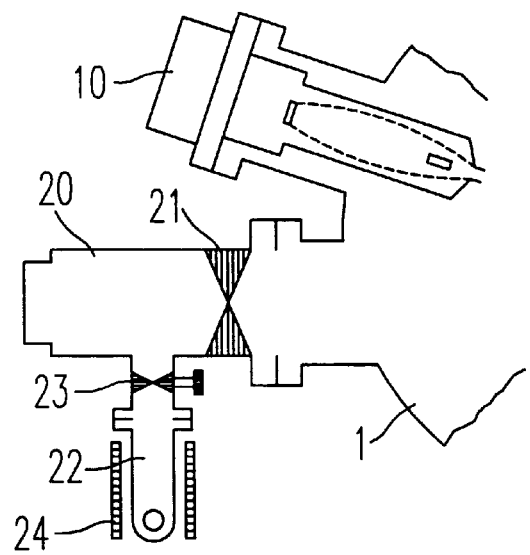
FIG. 3 is a partial schematic diagram of an apparatus used in Embodiment 3 of this invention.

The apparatus for manufacturing an organic monomolecular film comprised the growth chamber 1 in the apparatus shown in FIG. 1, to which the sample preparation chamber 20 shown in FIG. 3 was added. The sample preparation chamber 20 was separated from the growth chamber 1 in FIG. 1 by a gate valve 21, and a glass bottle 22 filled with octadecanethiol powder was installed within the sample preparation chamber 20 via a variable leak valve 23, with a resistive heater 24 which can melt the powder through the glass bottle 22.

An example of a monomolecular film manufacturing method using this apparatus is described.

As in Embodiment 1, a cleaned Si (111) substrate was transferred to the sample stage 3, heated by the heater 5, then cooled down slowly. As a result, the diffraction pattern of low-energy electron beams obtained was a 7×7 LEED (low energy electron diffraction) pattern of Si that is normally obtained, and this indicated that the surface had a 7×7 surface reconstructed structure. When this periodic structure was not obtained, the surface was sputter-cleaned with an ion gun as in Embodiment 1, and the above procedure was then repeated to obtain a 7×7 Si surface reconstructed structure.

Then, as in Embodiment 1, the As molecular beam source 4 was heated, and the mass spectrometer 13 was used to check whether As molecules had been emitted. The sample was transferred to a position in which it was faced to molecular beam, and the shutter was opened. The diffraction pattern of low-energy electron beams subsequently changed to modify the surface into a 1×1 structure. The sample was then quenched, and Auger electron spectroscopy was used to investigate the composition of the surface. It was then confirmed that the Si surface terminated by As atoms.

The sample S was then transferred to the sample preparation chamber 20 via the gate valve 21, and the glass bottle 22, which had been heated to about 150° C. by the resistive heater 24 to melt the octadecanethiol contained therein, was opened via the variable leak valve 23 to introduce octadecanethiol molecules into the sample preparation chamber 20 until the gas pressure had reached $10^{-6}$ Torr. About 10 minutes later, the diffraction of low-energy electron beams reflected from the sample S obtained indicating a √3× √3R30 pattern. The sample S was taken out from the chamber and investigated with reflection absorption infrared spectroscopy, and absorption was observed at 2916.7 $cm^{-1}$ and 2851.0 $cm^{-1}$. The surface was also investigated using photoelectron spectroscopy, and it was found that the As (1326 eV) and the Si (102 eV) peaks decreased and a C (287 eV) peak that had not been detected theretofore was observed. This indicated that a monomolecular film of octadecanethiol molecules had been formed on the Si surface terminated by As.

Embodiment 4

Figure 4:
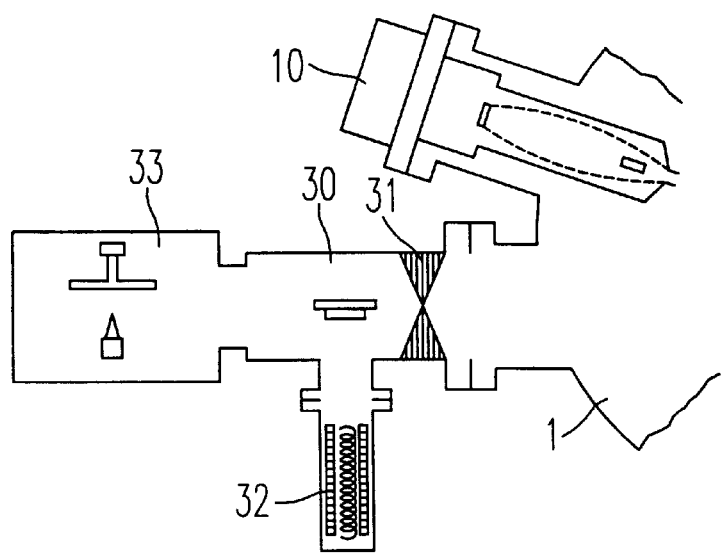
FIG. 4 is a partial schematic diagram of an apparatus used in Embodiment 4 of this invention.

The apparatus for manufacturing an organic monomolecular thin film comprised the growth chamber 1 in the apparatus shown in FIG. 1, to which the sample preparation chamber 30 shown in FIG. 4 was added. The sample preparation chamber 30 was separated from the deposition chamber 1 in FIG. 1 by a gate valve 31, and a Knudsen cell 32 filled with octadecanethiol powder was installed within the sample preparation chamber 30. Reference numeral 33 designates a scanning tunnel microscope head.

An example of a monomolecular film manufacturing method using this apparatus is described below.

As in Embodiment 1, a wet cleaned Si (100) substrate was transferred to the sample stage 3, heated to about 300° C. by the heater 5, and left to keep overnight. The sample was further heated to about 1,250° C., then cooled down slowly. The scanning tunnel microscope was then used to observe the surface of the sample. A 2×1 atomic arrangement in which SA and SB steps are alternatively formed was observed, and it was thus found that the surface had a 2×1 surface reconstructed structure. When this periodic structure was not obtained, the surface of the sample was etched using ion beams from the ion gun 12 in order to clean the surface, and the above procedure was repeated to obtain a 2×1 silicon surface reconstructed structure.

The sample was then transferred to a position in which it would not be exposed to the molecular beam, and the As molecular beam source 4 was heated to about 350 to 400° C. The mass spectrometer 13 was used to check whether As molecules had been emitted from the As molecular beam source 4. The shutter was then closed, the sample as transferred to a position in which it was faced to molecular beam, and the molecular beam source 4 was heated to 400° C. The shutter was then opened, and the diffraction pattern of low-energy electron beams gradually changed to modify the surface so as to have both 2×1 and a 2×4 structures. The Auger electron spectroscopy was used to examine the composition of the surface. An As (1230 eV) peak was observed in addition to an Si (92 eV and 1589 eV) peak, and the peak ratio of the elements was calculated to confirm that 0.5 ML of the Si surface terminated by As atoms. The shutter of the As molecular beam source 4 was closed after quenching the the sample.

The sample was then transferred to the sample preparation chamber 30, and the shutter of the Knudsen cell 32, which had been heated to about 150° C. to melt the octadecanethiol therein, was opened. The vacuum then decreased until the gas pressure had reached $10^{-6}$ Torr. The Knudsen cell condition was kept for 10 minutes. The scanning tunnel microscope was used to observe the sample showing a domain with a 2×4 atomic arrangement within a sea of 2×1 arrangements. The 2×4 domain was also found to be about 1.4 nm higher than the sea region. The sample S was taken out from the chamber and investigated with reflection absorption infrared spectroscopy to obtain a spectrum with absorption observed at 2916.7 $cm^{-1}$ and 2851.0 $cm^{-1}$. The surface was also confirmed using photoelectron spectroscopy, and it was found that the As (1326 eV) and the Si (102 eV) peaks decreased and a C (287 eV) peak that had not been seen theretofore was observed. This indicated that a monomolecular film of octadecanethiol molecules had been partially formed only on the Si (100) surface terminated by As.

What is claimed is:

1. An organic monomolecular film manufacturing method comprising the following steps: chemisorbing a monoatomic layer thickness of arsenic onto a clean surface of a Si substrate, then chemisorbing molecules with SH groups thereon to form a monomolecular film from said molecules on the Si substrate bonded through said monoatomic layer of arsenic.

2. An organic monomolecular film manufacturing method according to claim 1, wherein the Si substrate having chemisorbed thereon arsenic is immersed in a solution containing said molecules with SH groups.

3. An organic monomolecular film manufacturing method according to claim 1, wherein the Si substrate having arsenic chemisorbed therein is coated with molten molecules with SH groups.

4. An organic monomolecular film manufacturing method according to claim 1, wherein the Si substrate having arsenic chemisorbed thereon is exposed to vaporized molecules with SH groups.

5. An organic monomolecular film manufacturing method according to claim 1, wherein the molecules with SH groups are octadecanethiol.

6. An organic monomolecular film manufacturing method according to claim 2 wherein the Si substrate having arsenic chemisorbed thereon is immersed in an octadecanethiol solution diluted with pure ethanol.

7. An organic monomolecular film manufacturing method according to any of claims 1 to 6, wherein prior to the absorption of arsenic, an arsenic molecular beam source is heated to 250° C. to 1,000° C. to allow contaminants to be emitted.

8. An organic monomolecular film manufacturing method according to claim 1, wherein said Si substrate is Si (100) or Si (111).

9. An organic monomolecular film manufacturing method according to claim 1, wherein the Si substrate is heated at about 300° C. to about 1,250° C. prior to chemisorbing with As.

* * * * *